US006667873B2

(12) United States Patent
Lyke et al.

(10) Patent No.: US 6,667,873 B2
(45) Date of Patent: Dec. 23, 2003

(54) ADAPTIVE MANIFOLD

(75) Inventors: James C. Lyke, Albuquerque, NM (US); Warren G. Wilson, Albuquerque, NM (US); Ren H. Broyles, Albuquerque, NM (US)

(73) Assignee: The United States of America as represented by the Secretary of the Air Force, Washington, DC (US)

( * ) Notice: Subject to any disclaimer, the term of this patent is extended or adjusted under 35 U.S.C. 154(b) by 359 days.

(21) Appl. No.: 09/681,380

(22) Filed: Mar. 27, 2001

(65) Prior Publication Data

US 2002/0141130 A1 Oct. 3, 2002

(51) Int. Cl.[7] ............................................... H01H 47/00
(52) U.S. Cl. ...................................... 361/160; 361/152

(58) Field of Search .................................. 361/160, 152, 361/166, 167, 189, 190

(56) References Cited

U.S. PATENT DOCUMENTS

| 5,757,319 A | * | 5/1998 | Loo et al. ................... 342/375 |
| 5,852,617 A | * | 12/1998 | Mote, Jr. ..................... 714/726 |
| 6,191,663 B1 | * | 2/2001 | Hannah ..................... 333/17.3 |

* cited by examiner

*Primary Examiner*—Stephen W. Jackson
*Assistant Examiner*—James A Demakis
(74) *Attorney, Agent, or Firm*—James M. Skorich; Kenneth E. Callahan

(57) ABSTRACT

An adaptive electrical manifold is comprised of switchbox assemblies containing a plurality of non-volatile MEMS relay switches, apparatus for controlling these switches, and apparatus for controlling a daisy-chained group of switchbox assemblies.

1 Claim, 11 Drawing Sheets

ADAPTIVE MANIFOLD

FEDERAL RESEARCH STATEMENT PARAGRAPH

The conditions under which this invention was made are such as to entitle the Government of the United States under paragraph I(a) of Executive Order 10096, as represented by the Secretary of the Air Force, to the entire right, title and interest therein, including foreign rights.

BACKGROUND OF INVENTION

The present invention is in the field of reconfigurable wiring manifolds, and in particular, relates to electrical manifolds whose wiring patterns can be electrically reconfigured using an arrangement of pre-fabricated interconnection assemblies and switchbox devices employing multi-stable MEMS switches.

A wiring assembly is a multi-conductor configuration, which is used within an electronics circuit or between electronic circuits to form electrical power and signal connections. Simple examples include an ordinary printed wiring board (such as the motherboard of a personal computer), a cable (such as the printer cable in a computer or more elaborately a cable connecting two electronics boxes in an aircraft), or even an electrical package (which routes external pin terminal connections to the bond pad terminals of components within the package). Such wiring configurations are usually completely fixed, although it is possible to use jumpers or mechanical switches on the assembly to change a few connection patterns. It is also possible to rectify or modify connections in an assembly crudely, by physically severing wires or adding jumper wires to break or make, respectively, a new desired connection.

Relays have of course existed for well over one hundred years. The variety of relay referred to as "latching" have the property of remaining in an open or shorted ("off" or "on") state until changed, and they were the basis of the first crude memory devices. These devices can in fact be used to electrically reconfigure a wiring pattern, and they have been used for this purpose, but the traditional relays are bulky and cumbersome in this role. Hence, outside of telecommunications applications and power switching applications in which large cabinets can be dedicated to a mass switching function, the notion of using reconfigurable wiring harnesses within embedded or portable systems has not been pursued seriously.

An adaptive manifold involves a multi-conductor electrical wiring assembly, e.g., a package, board, or harness, with one or more programmable connections. Such a wiring assembly can be altered into a new wiring pattern without physically moving the wires themselves. The intent is to permit this to be done under automated and even remote control, to effect the ability to re-wire a system in situ.

The primary reason no adaptive manifolds have been built before is that relays are too cumbersome. Due to this impracticality, little thought has been given as to how it might be possible to exploit hundreds or thousands of latching relays within packages, circuit boards, and wiring harnesses. If one were to assume that it were possible to build a relay the size of a human hair, for example, then one might further contemplate schemes for exploiting such devices, which is essentially the original basis leading to the proposed invention. From this standpoint, one can exploit the rich basis of knowledge of graph theory and graph routing problems, which is the basis of field programmable gate arrays (FPGAs). The routing/switch-box problems are very complex computationally (referred to as non-deterministic polynomial time or "NP"-complete), but a number of excellent algorithmic approximations have been studied. In the design of FPGAs, transistors are used as switches, and a great deal of thought has been given as to how to arrange wires and switches to provide the greatest incremental flexibility. This field of endeavor is diametrically opposed to the large relays and wiring harnesses in that the dimensions are vastly smaller, and the number of devices involved are large (millions). Similarly, though, little thought has been given to the application of these techniques outside of a field programmable gate array, which is a monolithic piece of silicon, to an ordinary wiring harness.

Previous realizations of this concept of adaptive manifolds involved using transistors (FETs) as the switch elements. There are a number of disadvantages to this approach. The logical configuration of the manifold is lost when power is removed from the manifold. The insertion losses associated with a FET switch can be large, e.g., the on resistance can be high (~1 k$\Omega$). Similarly the coupling losses associated with a FET switch manifold are large since the gate channel circuit used to turn the FET on and off must be physically adjacent to the source and drain circuits of the FET. This results in coupling between the switched circuit and the switching circuit. In addition, for the gate voltage to control the channel resistance, the absolute value of the gate voltage must be near the voltages at the source and drain contacts. As the FET functions by controlling field penetration from the source to the drain, near means the absolute value of the gate voltage is near the absolute voltage of either the drain or source circuit.

It is one object of the present invention to overcome these disadvantages by employing MEMS switches. A MEMS switch is a mechanical switch that is truly bistable, once set, it is independent of external power. The on resistance of a MEMS switch is 5 orders of magnitude smaller (~10 m$\Omega$) than that of an FET. Furthermore, the control circuit of the MEMS switch is physically remote/removed from the switched circuit, which reduces coupling to a minimum. In the MEMS implementation of an adaptive manifold, the control circuit is both physically and electrically isolated from the switched circuit. This allows the control voltages to be orders of magnitude different from the switched voltages. It also allows the chaining of successive switches without limitation due to the absolute value of the switching voltages relative to the switched voltages.

SUMMARY OF INVENTION

The adaptive manifold of the present invention is comprised of: (a) one or more bistable MEMS switches on one or more integrated circuit chips; (b) a monolithically integrated or off-chip control component set that can program any of the switches; and (c) a means of programming any switch using commands issued on a serial-port based boundary scan method. In addition, this adaptive manifold can be extended by adding additional copies (identical copies or variants of this configuration) programmed through the same single port as the first device by daisy-chaining the boundary scan chain. Included is a means of verifying (reading) the configuration of each switch in the entire array through commands issued on the (c) interface. Alternatively, the control interface can be a bussed or multi-drop configuration wherein the control lines are in parallel for each device.

BRIEF DESCRIPTION OF DRAWINGS

The various features of novelty that characterize the invention are pointed out with particularity in the claims annexed to and forming a part of this disclosure. For a better understanding of the invention, its operating advantages, and specific objects attained by its uses, reference is made to the accompanying drawings and descriptive matter in which a preferred embodiment of the invention is illustrated.

DETAILED DESCRIPTION

Figure 1:
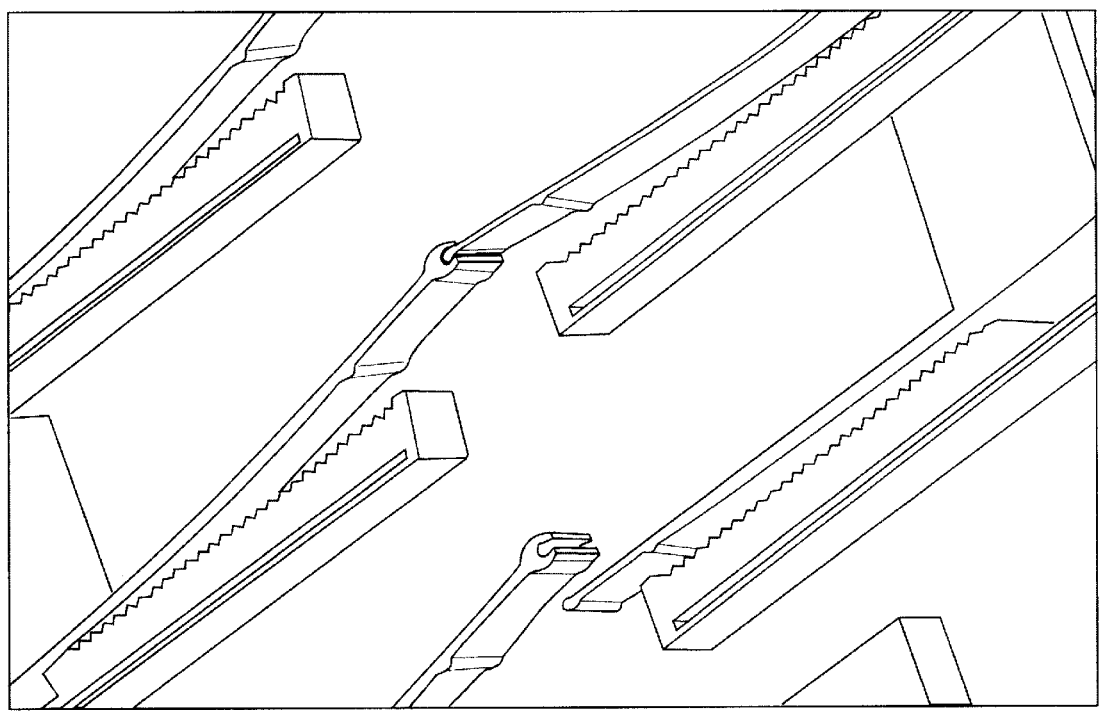
FIG. 1 illustrates a small array of three thermally actuated MEMS switches.
Figure 2:
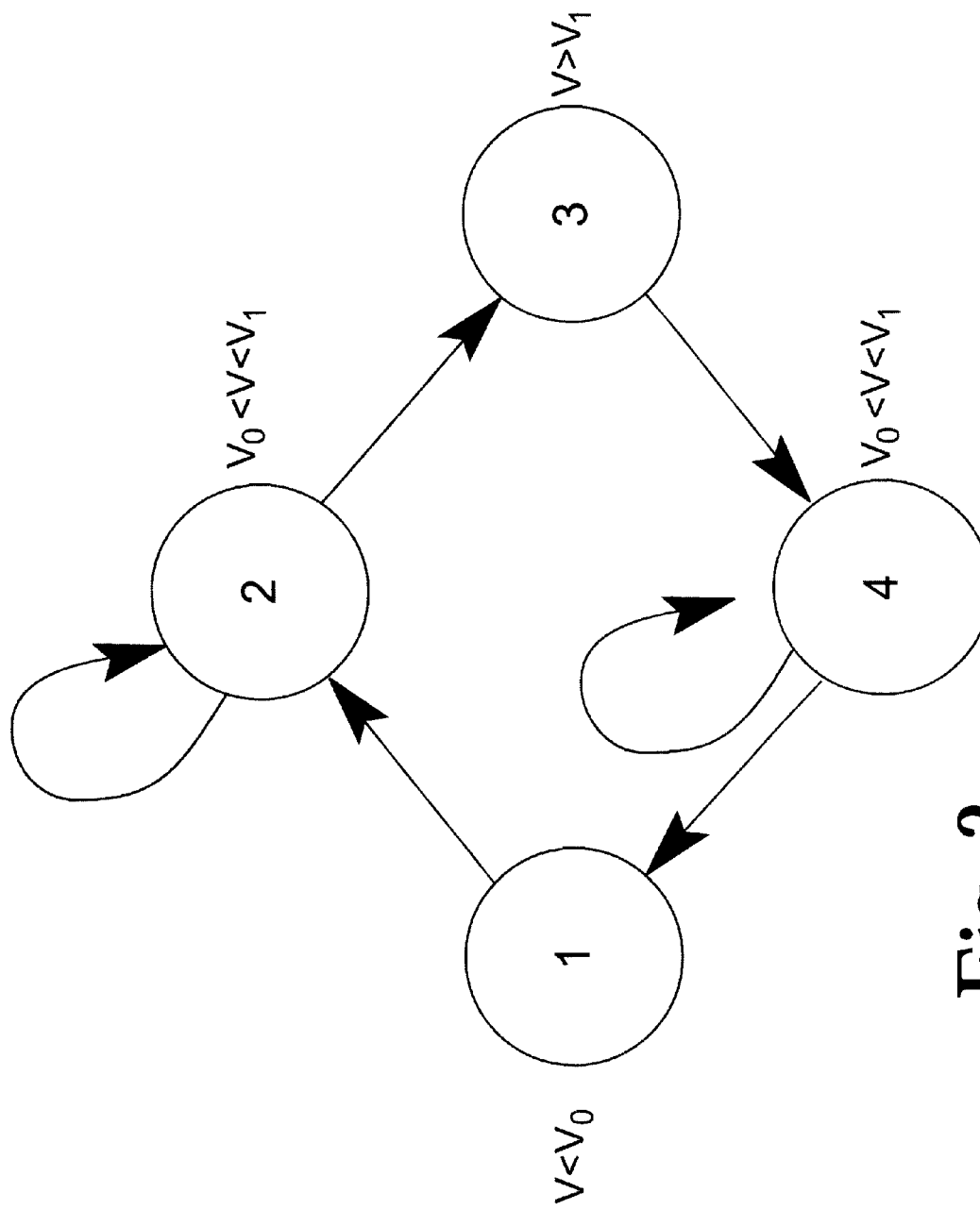
FIG. 2 shows an example state transition matrix of a bistable MEMS switch.
Figure 3:
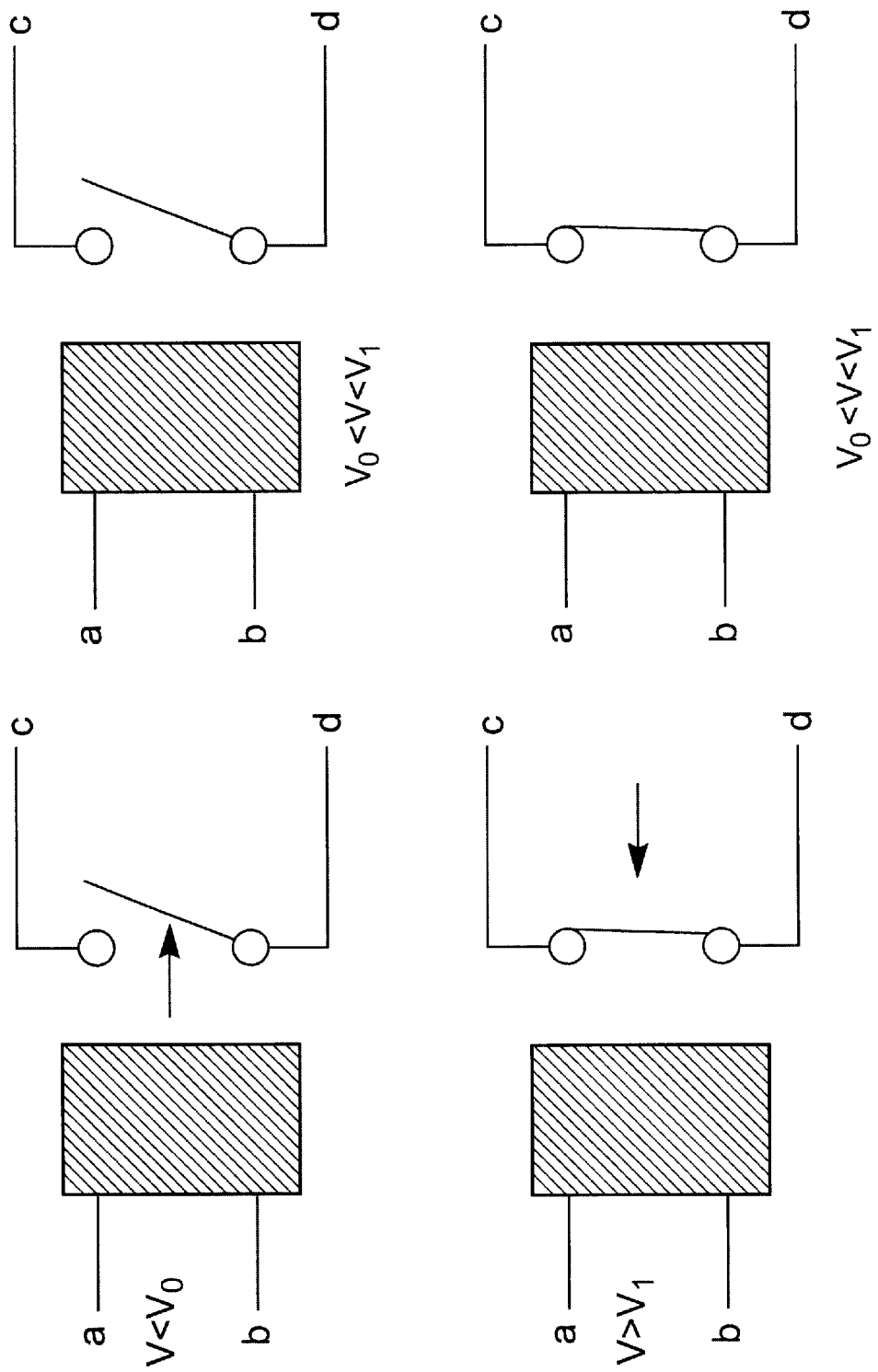
FIG. 3 illustrates the nonvolatile characteristics of a single-pole, single-throw (SPST) MEMS bistable relay.

Microelectromechanical systems (MEMS) approaches makes it possible to construct bistable relays that are 1,000–1,000,000 times smaller than the electromagnetic devices that have been used in a variety of systems for many decades. A number of concepts for relays in MEMS form have been proposed that employ one or more actuation principles (such as thermal, electromagnetic, electrostatic, and piezoelectric). One configuration, shown in FIG. 1, illustrates a small array of three such devices based on a thermal actuation approach. For the present invention, it is necessary that MEMS switches used have at least two (bistable) or more (multi-stable) states that can be reverted to repetitively under electrical control. An example state transition matrix of a bistable MEMS switch is shown in FIG. 2. The key point in this state transition matrix is that once a switch is put into a stable state, it remains in that state indefinitely, even upon removal of electrical power. FIG. 3 illustrates this explicitly for a single-pole, single-throw (SPST) MEMS bistable relay. It is most important that the switch configuration be maintained as non-volatile, otherwise any manifold containing them would lose its connective integrity upon power removal, dramatically limiting the utility of the device. The state transition matrix and switch configuration can be generalized from FIGS. 2 and 3 to any number of states and termini (to m P n T), although SPST and single-pole, double-throw (SPDT) configurations are the most common ones in current practice.

In the most primitive form, a MEMS relay should have four distinct termini, two for control and two for operation. It is important that the control of the MEMS switch does not require coupling with the operating termini. This requirement is taken for granted in "macro"-relays, but a number of MEMS relay concepts do share control and operation termini. Such a configuration of MEMS switch is not useable in manifold applications, since the electrical coupling of the manifold with its control cannot be separated, interfering with and limiting the utility of such an arrangement.

Since MEMS relay switches are batch fabricated, often using techniques adapted from silicon integrated circuits, it is conceivable that a single monolithic chip can contain a large number or an array of devices. The control signals may be aggregated, by for example using a common terminal. The operating termini may be kept completely separated or combined, which allows for the convenient implementation of very complex configurations. On the other hand, a monolithic chip may only contain one MEMS relay device.

The control of a MEMS relay requires an application of an external voltage. In some cases, the voltage is an unusually high voltage or is in other ways incompatible with the types of voltages used in standard digital electronics. In fact, some MEMS relay devices require a sequence of electromechanical events to place the device into its various states. The FIG. 1 device for example requires activating one heater to turn on the switch and activating a second to turn it off. So even a simple bistable MEMS switch may require a distinct sequence of events to effect a 0→1 transition and a separate sequence of events to effect a 1→0 transition. FIGS. 2 and 3 could be replaced with more elaborate versions to reflect such sequences. For all of these reasons, it is not unusual to consider that an auxiliary component or set of components might be employed in a MEMS relay simply to control the MEMS device. Ideally, such a control chip(s) would be compatible with voltages generated by ordinary digital systems and generate the necessary signals to sequence the MEMS relay between its various stable states. The control chip(s) could in fact be monolithically integrated into the same chip that contains the MEMS relays. More often than not, however, it is easier to separate them onto separate chips.

Figure 4:
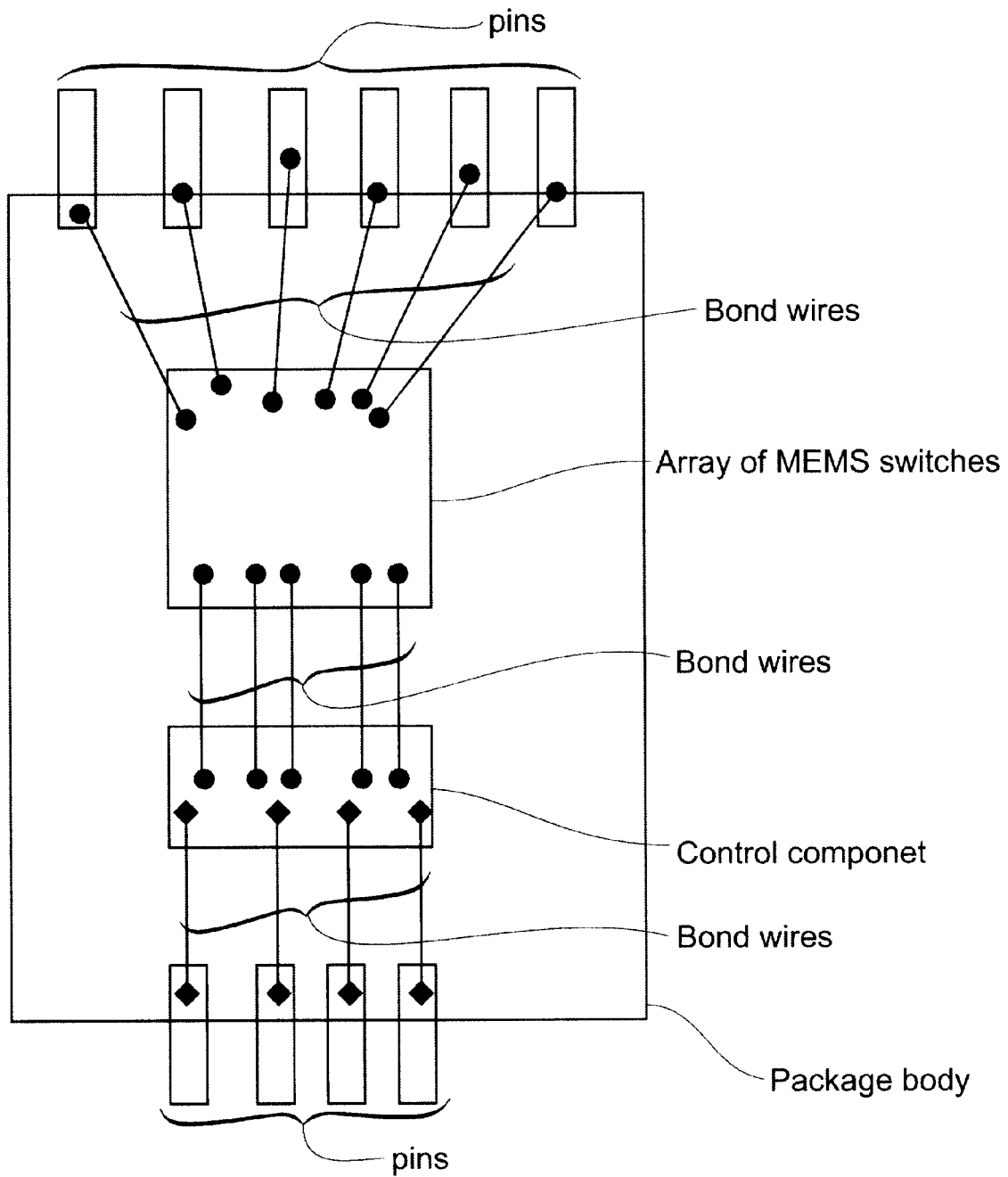
FIG. 4 illustrates a simple form of integrated packaging that could be used to form a MEMS relay switchbox consisting of a single MEMS relay component and a single-component control chip.
Figure 5A:
FIG. 5 shows how a multi-layered metal-dielectric system might be formed into switchbox packages and brought together onto the same wiring media.
Figure 5B:
Figure 5C:
Figure 5D:
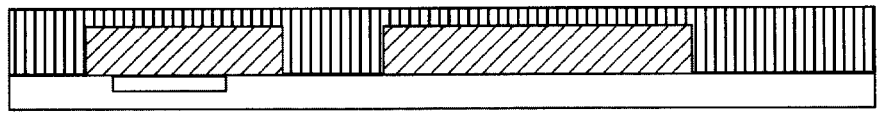
Figure 5E:
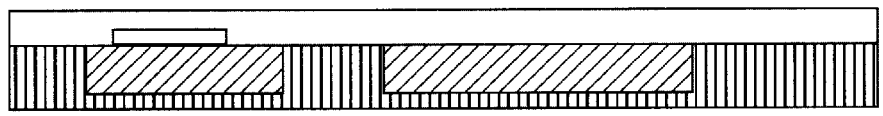
Figure 5F:
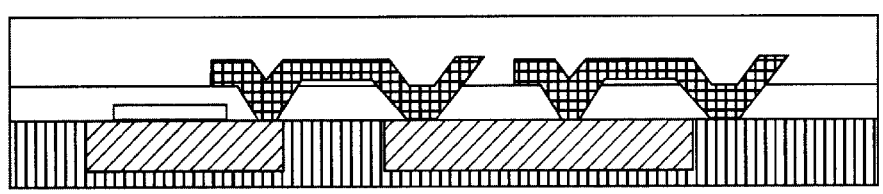
Figure 5G:
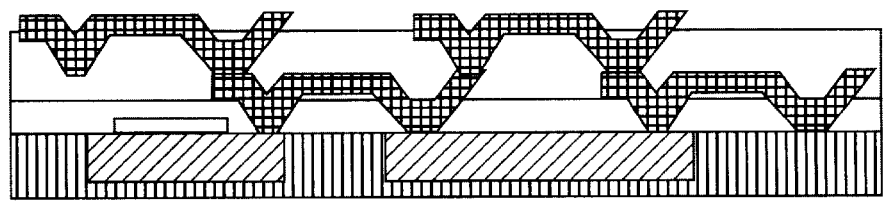
Figure 5I:
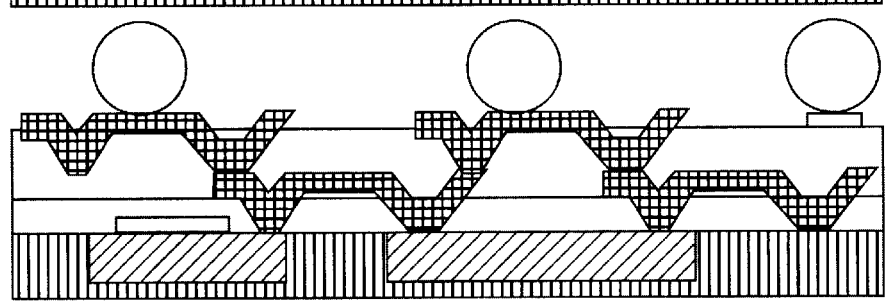
Figure 5J:
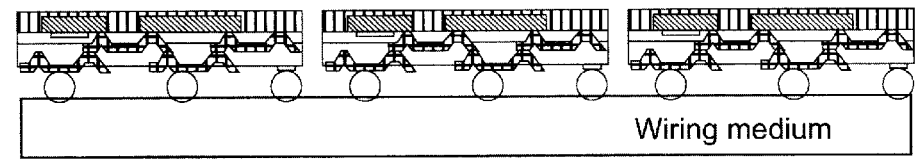

For convenience, it is possible to define a switchbox assembly as a combination of one or more MEMS integrated relay "chips", each of which contain one or more monolithically integrated relays and the control chip necessary to support voltage conversion and sequencing. The most degenerate case (not shown) would be a single MEMS bistable SPST relay with monolithically integrated control. Another configuration would involve the hybrid packaging of these components together. FIGS. 4 and 5 show simple and elaborate forms of integrated packaging that could be used to form a MEMS relay switchbox. FIG. 4 illustrates a fairly simple wire bonded hybrid assembly containing a single MEMS relay component (contains one or more MEMS relays on a monolithic chip) and a single-component control chip. FIG. 4 symbolically depicts wire bonding between the components and the pins of a package. FIG. 5 symbolically depicts a more elegant patterned overlay-packaging concept in which a multi-layer metal-dielectric system is directly formed onto the two components. Subsequently, the solder balls of a chip scale ball grid array are processed onto the overlay, resulting in a compact package. As shown in the last picture in the FIG. 5 sequence, a number of similar switchbox packages are brought together onto the same wiring media.

The wiring media constitutes the last physical piece of the proposed invention based on previously existing art. The wiring media is in general any sort of rigid or flexible multi-layer, multi-conductor planar assembly, like a circuit board or flexible cable harness, onto which are patterned receptacles for interfacing switch boxes. The wiring media could in fact integrate any number of ordinary electronic components, in which case the function and structure of the adaptive manifold is co-mingled with ordinary electronic circuits. This co-mingling would be most economical and result in the best overall electrical performance, particularly in some high-volume, high-performance applications. On the other hand, the adaptive manifold could contain only the multiplicity of switchboxes necessary to establish a repetitively reconfigurable wiring assembly, in which a subset of connections are altered by placing relays within switchboxes mounted on the manifold into different states.

Figure 6:
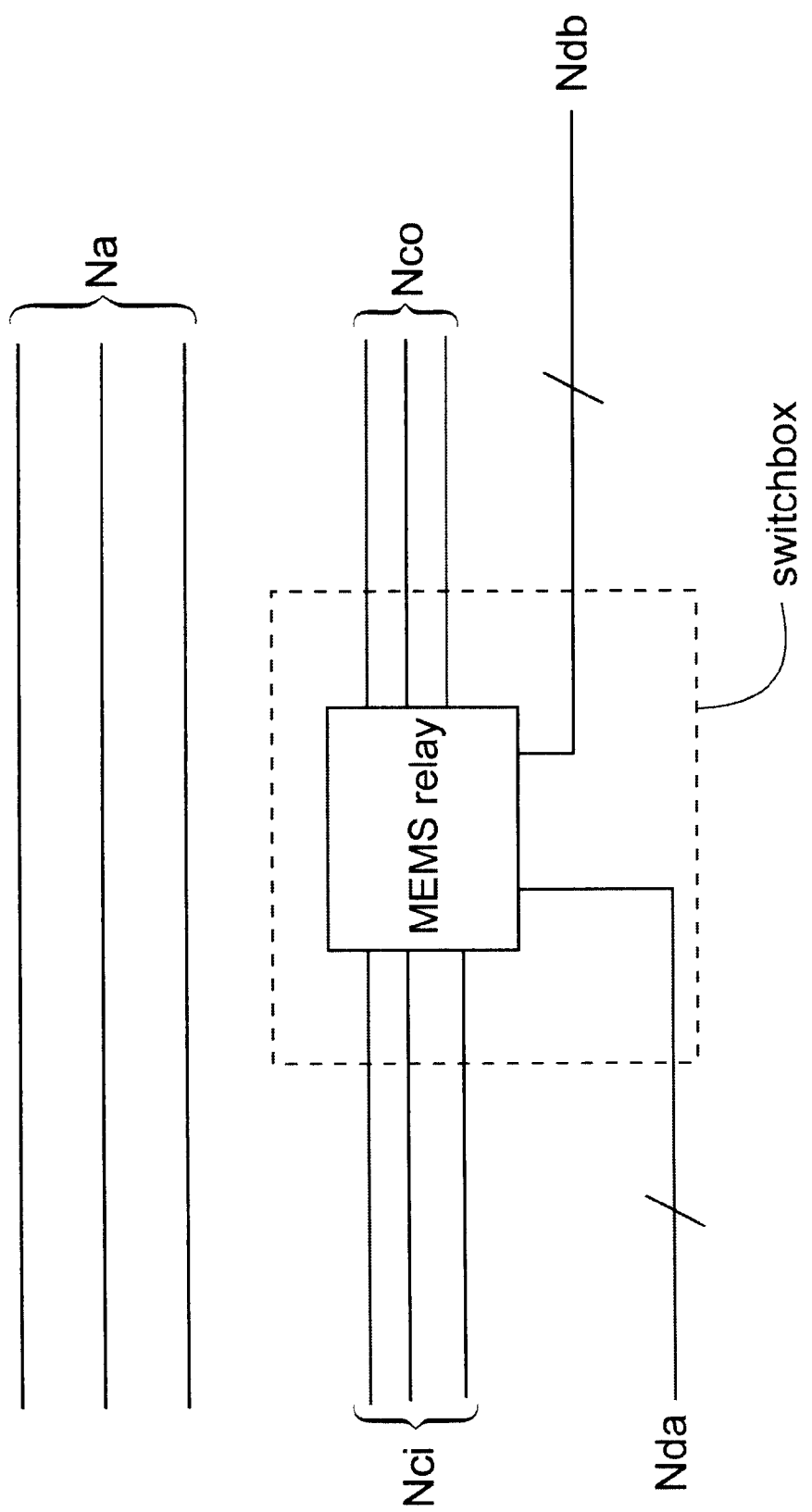
FIG. 6 illustrates an adaptive manifold that contains a single MEMS switchbox that can be daisy-chained to additional MEMS switchboxes.

One simple embodiment of the present invention is shown in FIG. 6. It shows an adaptive manifold that contains a single MEMS switchbox. The switchbox contains a number of terminals needed to support control and operation of the MEMS relays contained within. Here control refers to: (1) control of the state of each MEMS relay (one or more in the switchbox) whose state remains unaltered upon removal of power, (2) verification of the state configuration of each switch, (3) support of command-based control through a serial interface (such as JTAG), and (4) support of cascading through daisy-chained extension of a number of similar assemblies. The manifold physically contains zero or more pass-through signals Na, which are contained for convenience. The pass-through signals are defined as signals that do not interact with the MEMS relays in the manifold but are merely in the manifold for convenience. Otherwise, a system would need to be separated into two manifolds, one containing only adaptive connections (those involving MEMS relays) and one containing only fixed wiring patterns. In this simplest case, a single MEMS switchbox is contained in the manifold. The switchbox contains an array of one or more MEMS relays with a total of two more input and output operation signals (Nci+Nco). The switchbox also contains a control interface, which can be cascaded through daisy chaining (Nda=Ndb).

Figure 7:
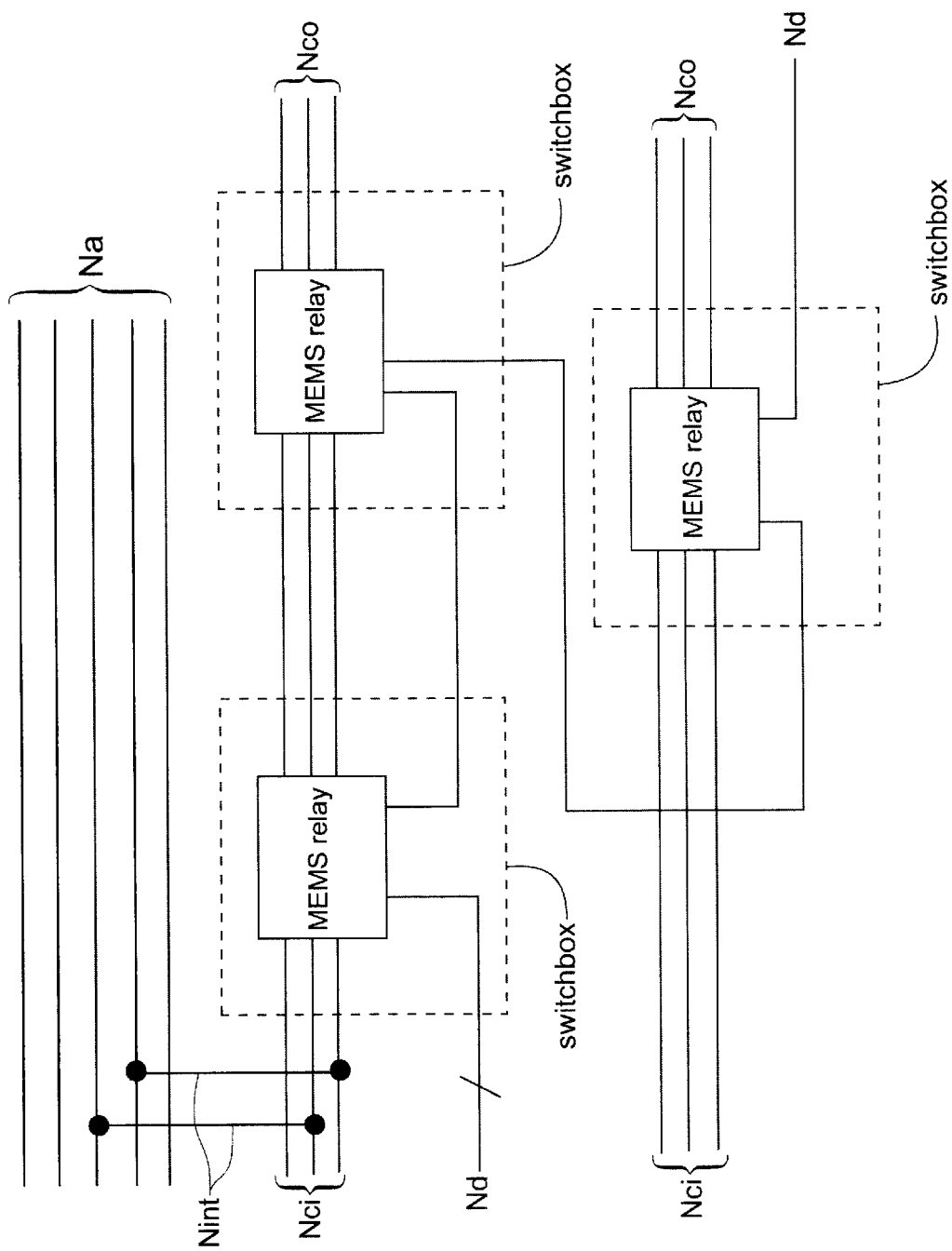
FIG. 7 illustrates a plurality of daisy-chained MEMS switchboxes.

FIG. 7 depicts a more involved manifold. Here, a number of MEMS switchboxes are involved. Some of the Na pass-through wires may interact with the MEMS switchbox operating terminals (depicted by the Nint internal connections). Several MEMS switchboxes are networked into the manifold. The control switchboxes are brought together by daisy-chaining the output of one to another. The programmation of any switch of any switchbox is facilitated using commands. The JTAG standard provides for the daisy-chained connection of an indefinite number of devices, and the group of cascaded devices is referred to as a scan chain. The setting and verification of setting any device in the scan chain is facilitated through commands placed onto the Nd serial port.

Figure 8:
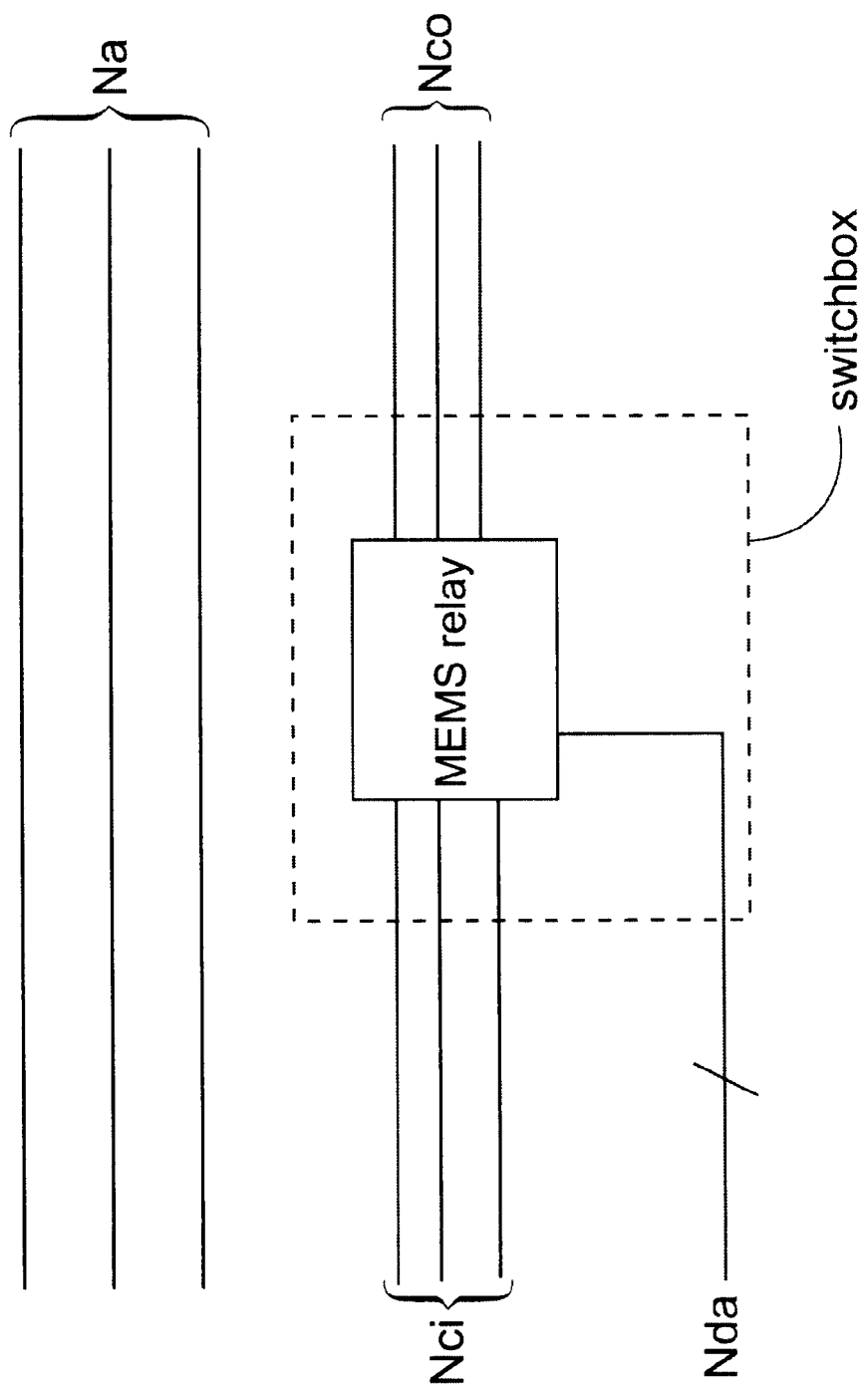
FIG. 8 shows an adaptive manifold containing a single MEMS switchbox that can be connected with additional MEMS switchboxes via a multi-drop parallel bus arrangement.
Figure 9:
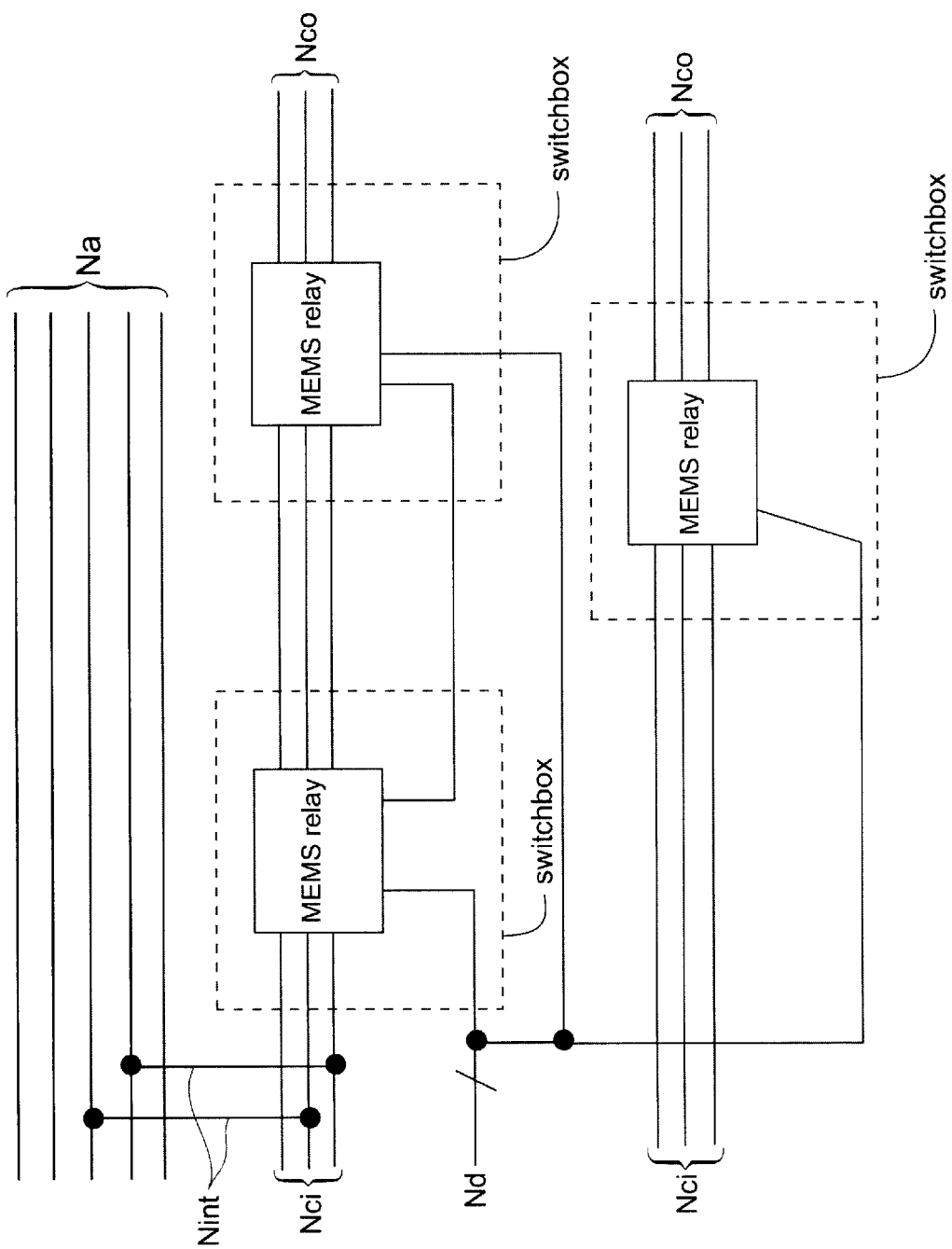
FIG. 9 illustrates a plurality of multi-drop parallel bus-connected MEMS switch boxes.

There are alternative ways to network a plurality of MEMS switchboxes together other than the scan chain discussed above. FIG. 8 illustrates a single switchbox set up for a multi-drop connection. FIG. 9 illustrates the concept for a plurality of switchboxes in which all of the Nda lines are connected in parallel for each switchbox. The means to control/monitor the switchbox can be through a multi-drop interface employing either a serial interface (e.g., MIL-STD-1553, RS-485 or equivalent) or a parallel bus interface (e.g., VME, PCI, ISA, Futurebus, or equivalent). The only fundamental difference between multi-drop serial busses and parallel busses is the number of lines in the connection that are in parallel.

Figure 10:
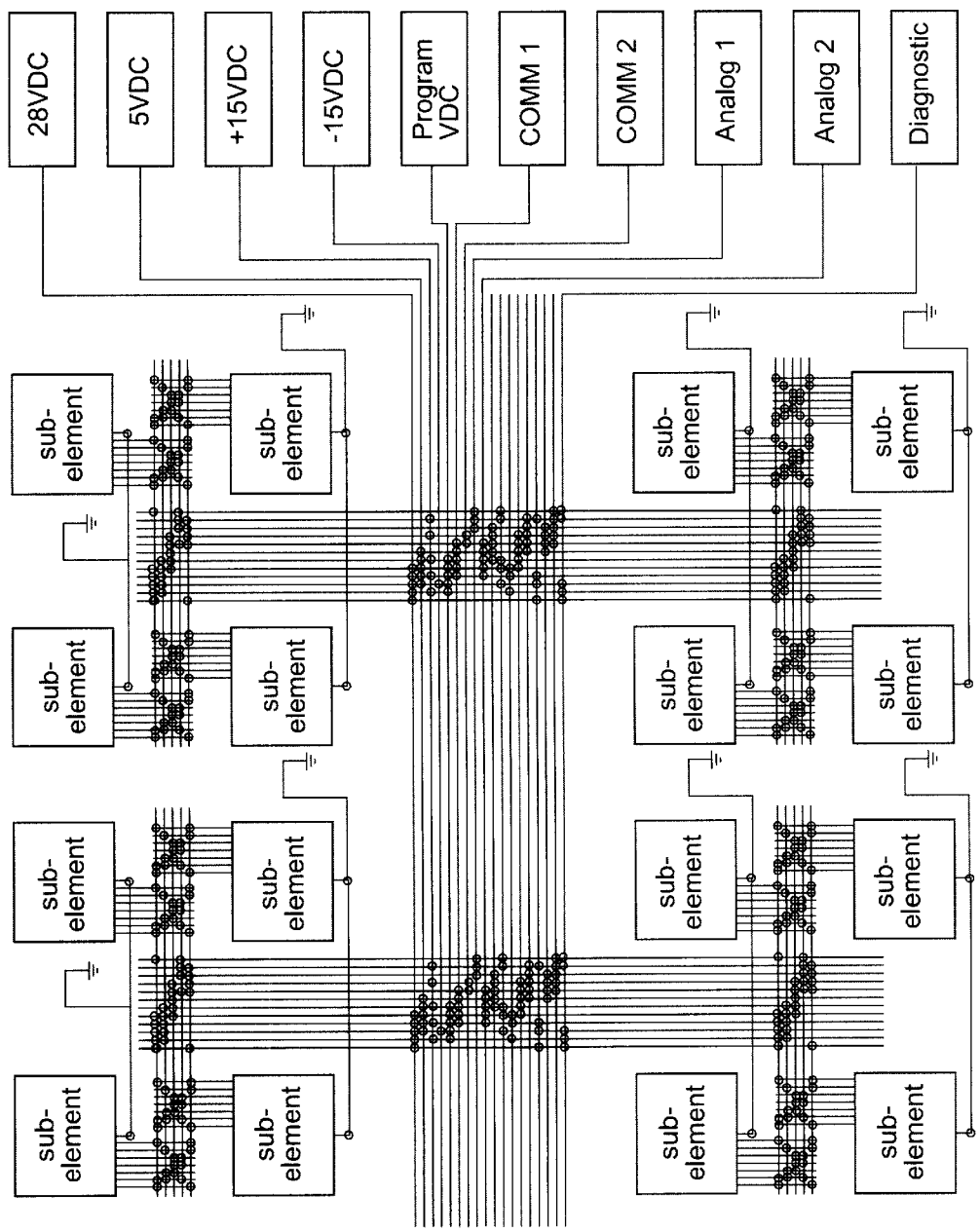
FIG. 10 shows an example avionics system application of the invention.
Figure 11:
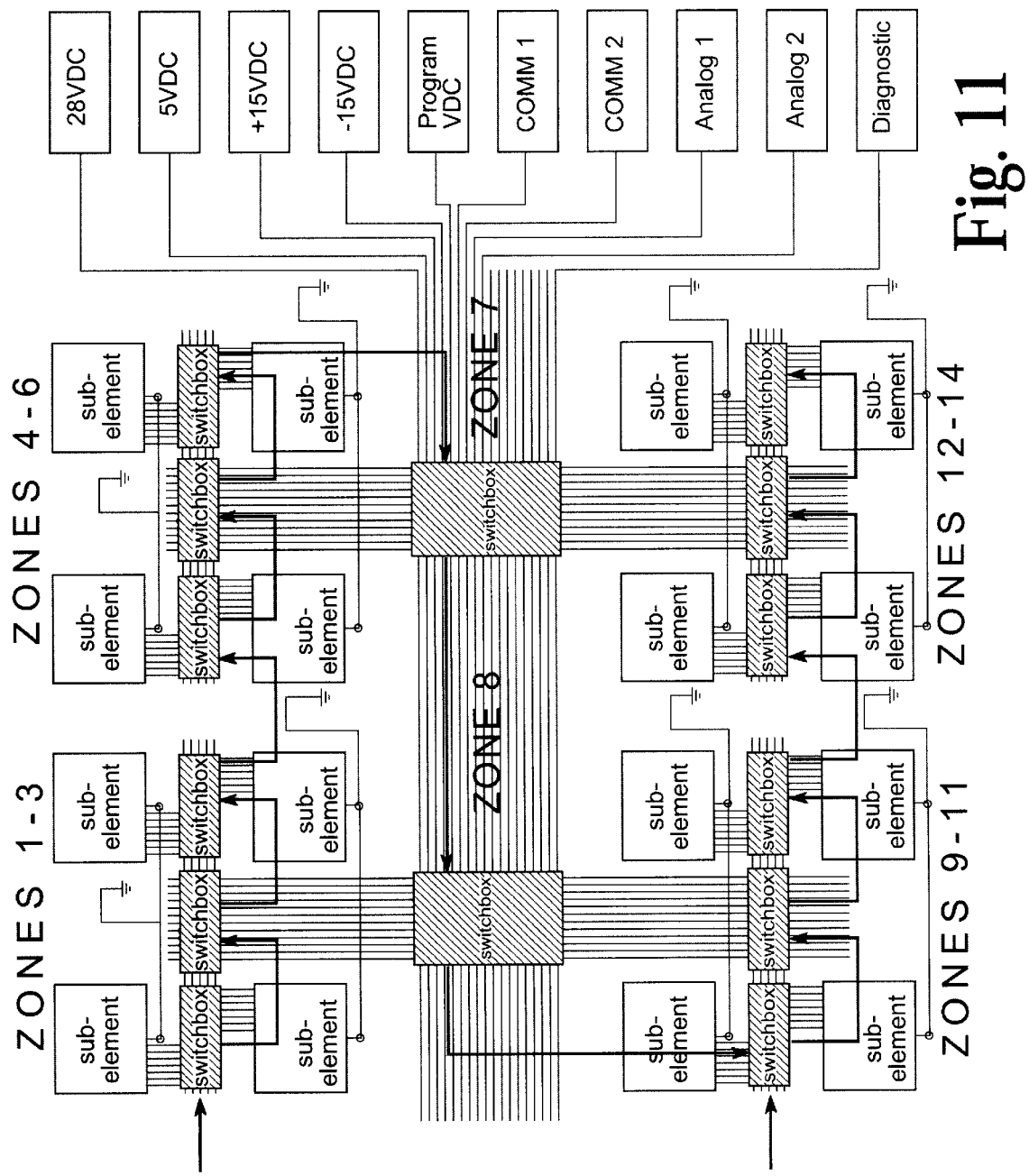
FIG. 11 shows a partition into zones of the FIG. 8 system, each zone being a complex switchbox.

As an example of a potential system application of a more detailed embodiment, FIGS. 10 and 11 depict a modular avionics system in which a number of specific and general sub-elements are combined. This larger scale embodiment demonstrates reconfigurable routing within a manifold. Each crossing wire pair containing a circle symbolically represents a SPST MEMS relay. By controlling the closure of individual switches through a deliberate pattern, the adaptive manifold can be configured in a vast number of configurations ($2^n$, where n is the number of switches) under control of a single control port. FIG. 11 attempts to define one possible partition of the manifold into zones. In this case, fourteen zones are suggested, and each zone is "covered" by a complex switchbox, which would contain an array of MEMS switches.

Programming the adaptive manifold would involve an approach similar to the approach used to route field programmable gate arrays (FPGAs). Routing in this case would be referred to as a graph Steiner forest. The wires and switches of the adaptive manifold become the nodes and edges (respectively) of a graph problem, and establishing the routing problem becomes a computation problem of finding a set of paths between the desired termini (nodes) by closing the appropriate switches (edges). In this manner, developing programs to determine the switch settings on an adaptive manifold would be mathematically equivalent to computing routing paths within FPGAs. The entire manifold can be thus represented as a graph, which can be manipulated using a number of existing heuristics.

The command language used to control and program the manifold would be based on an implementation assuming a JTAG approach. It could be adapted to other control schemes as well, such as alternate serial interfaces (e.g., controller area network, MIL-STD-1553) or alternate parallel interfaces (e.g., VME/PCI bus controllable). Its minimal provisions include: (1) establishing the number of switchboxes on a scan chain; (2) establishing the number of switches in each switch box; (3) reading the configuration of each switch in the switchbox; and (4) setting the configuration of each switch individually or en masse in the switchbox. Optional requirements that would potentially be useful are the storage of a compact graph structure for the adaptive manifold in the switchboxes themselves, and the implementation of identification information, change history, etc. for maintenance purposes. Reading the configuration of each switch in the switchbox can be implemented through non-intrusive monitoring or by simply backing up the state information into a non-volatile memory within the switchbox itself. In this case, it is desirable to implement an additional command structure, one that simply executes a shadow transfer of the non-volatile memory to the switches.

A number of alternative embodiments/extensions are briefly outlined. It is possible to divide long scan chains into multiple chains. Therefore, a manifold might implement a number (greater than one) of boundary scan chains to configure and control switchboxes. The contents of hybrid packages such as those suggested in FIGS. 4 and 5 could be directly integrated onto the wiring media of the adaptive manifold through direct chip attachment approaches. Any number of packaging approaches are conceivable, resulting in the same equivalent end result of an adaptive manifold.

For the case of tri-stable, quad-stable, m P n T MEMS relays, the same control principles apply, but may be extended. One simple extension concept for control language is to map the n states into a binary field, and to set each bit in the field with the command structure normally used to set only one bit.

It is also possible, using resident memory in the switchbox, to define a number of different wiring patterns as a palette-selectable configuration approach, in which the wiring of the manifold can be altered rapidly through extension of the command language. This feature could be implemented on a per switchbox or a total ensemble basis through extension of the command language and internal memory within the switchbox control component. This feature is particularly useful for rotating between diagnostic and one or more operational configurations.

What is claimed is:

1. An adaptive manifold electrical wiring assembly with a plurality of programmable connections, said adaptive manifold comprised of:

one or more switchbox assemblies containing at least one non-volatile bistable MEMS relay switch;

at least two control termini and two operation termini, said control termini not being electrically coupled to said operation termini, for controlling said at least one MEMS relays switch whereby each said MEMS relay switch can be set and its state verified; and means for controlling a plurality of said switchbox assemblies connected together.

* * * * *